(12) United States Patent
Zuppero et al.

(10) Patent No.: US 7,371,962 B2
(45) Date of Patent: May 13, 2008

(54) DIODE ENERGY CONVERTER FOR CHEMICAL KINETIC ELECTRON ENERGY TRANSFER

(75) Inventors: Anthony C. Zuppero, Pollock Pines, CA (US); Jawahar M. Gidwani, San Francisco, CA (US)

(73) Assignee: NeoKismet, LLC, San Francisco, CA (US)

( * ) Notice: Subject to any disclaimer, the term of this patent is extended or adjusted under 35 U.S.C. 154(b) by 751 days.

(21) Appl. No.: 10/759,341

(22) Filed: Jan. 16, 2004

(65) Prior Publication Data

US 2004/0182431 A1 Sep. 23, 2004

Related U.S. Application Data

(60) Continuation-in-part of application No. 10/038,257, filed on Oct. 24, 2001, now Pat. No. 6,700,056, which is a continuation of application No. 09/589,669, filed on Jun. 7, 2000, now Pat. No. 6,327,859, which is a division of application No. 09/304,979, filed on May 4, 1999, now Pat. No. 6,114,620.

(51) Int. Cl.
*H01L 31/00* (2006.01)
*H02N 1/00* (2006.01)
*F15B 21/12* (2006.01)

(52) U.S. Cl. ............... 136/252; 136/253; 136/255; 310/300; 310/314; 60/721; 60/532

(58) Field of Classification Search ........... 136/252, 136/253, 255; 310/300, 314, 322; 60/721, 60/532
See application file for complete search history.

(56) References Cited

U.S. PATENT DOCUMENTS

| | | | |
|---|---|---|---|
| 3,483,040 A | 12/1969 | Parkins | |
| 3,694,770 A | 9/1972 | Burwell et al. | |
| 3,916,338 A | 10/1975 | Jensen et al. | |
| 3,925,235 A | 12/1975 | Lee | |
| 4,012,301 A | 3/1977 | Rich et al. | |

(Continued)

FOREIGN PATENT DOCUMENTS

DE 1230509 12/1966

(Continued)

OTHER PUBLICATIONS

H. Okada et al, "Electrical Characteristics and Reliability of Pt/Ti/Pt/Au Ohmic Contacts to p-Type GaAs", J. Appl. Phys. 30, L558-L560. (1991).*

(Continued)

*Primary Examiner*—Nam Nguyen
*Assistant Examiner*—Jeffrey Barton
(74) *Attorney, Agent, or Firm*—Orrick, Herrington & Sutcliffe LLP

(57) ABSTRACT

An improved diode energy converter for chemical kinetic electron energy transfer is formed using nanostructures and includes identifiable regions associated with chemical reactions isolated chemically from other regions in the converter, a region associated with an area that forms energy barriers of the desired height, a region associated with tailoring the boundary between semiconductor material and metal materials so that the junction does not tear apart, and a region associated with removing heat from the semiconductor.

3 Claims, 4 Drawing Sheets

U.S. PATENT DOCUMENTS

| | | |
|---|---|---|
| 4,045,359 A | 8/1977 | Fletcher et al. |
| 4,407,705 A | 10/1983 | Garscadden et al. |
| 4,590,507 A | 5/1986 | Capasso et al. |
| 4,634,641 A | 1/1987 | Nozik |
| 4,651,324 A | 3/1987 | Prein et al. |
| 4,686,550 A | 8/1987 | Capasso et al. |
| 4,753,579 A | 6/1988 | Murphy |
| 4,756,000 A | 7/1988 | Macken |
| 4,793,799 A | 12/1988 | Goldstein et al. |
| 4,849,799 A | 7/1989 | Capasso et al. |
| 5,048,042 A | 9/1991 | Moser et al. |
| 5,057,162 A | 10/1991 | Nelson |
| 5,124,610 A | 6/1992 | Conley et al. |
| 5,293,857 A | 3/1994 | Meyer |
| 5,299,422 A | 4/1994 | Nakagawa et al. |
| 5,311,009 A | 5/1994 | Capasso et al. |
| 5,317,876 A | 6/1994 | Nakagawa et al. |
| 5,337,329 A | 8/1994 | Foster |
| 5,362,975 A | 11/1994 | von Windheim et al. |
| 5,404,712 A | 4/1995 | Feu et al. |
| 5,408,967 A | 4/1995 | Foster |
| 5,470,395 A | 11/1995 | Yater et al. |
| 5,488,231 A | 1/1996 | Kwon et al. |
| 5,525,041 A | 6/1996 | Deak |
| 5,587,827 A | 12/1996 | Hakimi et al. |
| 5,593,509 A | 1/1997 | Zuppero et al. |
| 5,632,870 A | 5/1997 | Kucherov |
| 5,641,585 A | 6/1997 | Lessing et al. |
| 5,651,838 A | 7/1997 | Fraas et al. |
| 5,674,698 A | 10/1997 | Zarling et al. |
| 5,698,397 A | 12/1997 | Zarling et al. |
| 5,736,410 A | 4/1998 | Zarling et al. |
| 5,740,192 A * | 4/1998 | Hatano et al. ........... 372/45.01 |
| 5,757,833 A | 5/1998 | Arakawa et al. |
| 5,763,189 A | 6/1998 | Buechler et al. |
| 5,780,727 A | 7/1998 | Gimzewski et al. |
| 5,891,656 A | 4/1999 | Zarling et al. |
| 5,917,195 A | 6/1999 | Brown |
| 5,932,885 A | 8/1999 | DeBellis et al. |
| 5,999,547 A | 12/1999 | Schneider et al. |
| 6,067,309 A | 5/2000 | Onomura et al. |
| 6,084,173 A | 7/2000 | DiMatteo |
| 6,114,620 A | 9/2000 | Zuppero et al. |
| 6,119,651 A | 9/2000 | Anderson |
| 6,159,686 A | 12/2000 | Kardos et al. |
| 6,172,427 B1 | 1/2001 | Shinohara et al. |
| 6,218,608 B1 | 4/2001 | Zuppero et al. |
| 6,222,116 B1 | 4/2001 | Zuppero et al. |
| 6,232,546 B1 | 5/2001 | DiMatteo et al. |
| 6,238,931 B1 | 5/2001 | Buechler et al. |
| 6,251,687 B1 | 6/2001 | Buechler et al. |
| 6,268,560 B1 | 7/2001 | Zuppero et al. |
| 6,312,914 B1 | 11/2001 | Kardos et al. |
| 6,327,859 B1 | 12/2001 | Zuppero et al. |
| 6,396,191 B1 | 5/2002 | Hagelstein et al. |
| 6,399,397 B1 | 6/2002 | Zarling et al. |
| 6,444,476 B1 | 9/2002 | Morgan |
| 6,537,829 B1 | 3/2003 | Zarling et al. |
| 6,649,823 B2 | 11/2003 | Zuppero et al. |
| 6,678,305 B1 | 1/2004 | Zuppero et al. |
| 6,700,056 B2 | 3/2004 | Zuppero et al. |
| 6,903,433 B1 | 6/2005 | McFarland et al. |
| 6,916,451 B1 | 7/2005 | Zuppero et al. |
| 6,944,202 B2 | 9/2005 | Zuppero et al. |
| 7,057,213 B2 | 6/2006 | McFarland et al. |
| 2001/0018923 A1 | 9/2001 | Zuppero et al. |
| 2002/0017827 A1 | 2/2002 | Zuppero et al. |
| 2002/0045190 A1 | 4/2002 | Wilson |
| 2002/0070632 A1 | 6/2002 | Zuppero et al. |
| 2002/0121088 A1 | 9/2002 | Zuppero et al. |
| 2002/0196825 A1 | 12/2002 | Zuppero et al. |
| 2003/0000570 A1 | 1/2003 | Zuppero et al. |
| 2003/0019517 A1 | 1/2003 | McFarland |
| 2003/0030067 A1 | 2/2003 | Chen |
| 2003/0100119 A1 | 5/2003 | Weinberg et al. |
| 2003/0166307 A1 | 9/2003 | Zuppero et al. |
| 2003/0207331 A1 | 11/2003 | Wilson et al. |
| 2004/0182431 A1 | 9/2004 | Zuppero et al. |
| 2005/0189011 A1 | 9/2005 | Zuppero et al. |

FOREIGN PATENT DOCUMENTS

| | | |
|---|---|---|
| DE | 37 43 399 A1 | 7/1989 |
| EP | 0713089 | 5/1996 |
| JP | 63-42181 | 2/1988 |
| JP | 02157012 A | 6/1990 |
| JP | 2-264101 | 10/1990 |
| NL | 1065463 | 4/1967 |
| WO | WO 00/72384 A1 | 11/2000 |
| WO | WO 01/28677 A1 | 4/2001 |
| WO | WO 01/29938 A1 | 4/2001 |
| WO | WO 01/54171 A1 | 7/2001 |

OTHER PUBLICATIONS

M.T. Hirsch et al, "Correlation of Microstructure with Electrical Behavior of Ti/GaN Schottky Contacts", J. Electron. Mater. 27, 1236-1239. (1998).*

Steinbrüchel et al., "Energy Dissipation in Catalysis", University of Minnesota, Aug. 1973, pp. 267-270.

Schonnhammer et al., "Energy Dissipation at Metal Surfaces: Electronic Versus Vibrational Excitations," Journal of Electron Spectroscopy and Related Phenomena, (1983) p. 93-101.

"Electron-hole pair creation by reactions at metal surfaces", downloaded from www.aps.org/meet/CENT99/BAPS/abs?S6980001. html American Physical Society Centernnial Meeting Program, Atalanta, GA, Mar. 20-26, 1999.

"Electron-Hole Pair Creation at Ag and Cu Surfaces by Adsorption of Atomic Hydrogen and Deuterium", Physical Review Letters, vol. 82, No. 2. Jan. 11, 1999.

"The Solarex Guide to Solar Electricity" Solarex Corporation, Inc. Frederich, MD, pp. 66-67, Apr. 1979.

Harrison, P. et al., The Carrier Dynamics of Far-Infrared Intersubband Lasers and Tunable Emitters, Institute of Microwaves and Photonics, University of Leeds, U.K., pp. 1-64, date unknown.

Weber, et al., to X2 Electron Transfer Times In Type-II GaAs/A1As Superflattices Due to Emission of Confined and Interface Phonons, Superlattices and Microstructures, vol. 23, No. 2 (1998).

Fann, W.S. et al., Electron Thermalization in Gold, Physical Review B, Brief Reports, vol. 46, No. 20, (1992).

Ultrafast Surface Dynamics Group, Time-Resolved Two-Photon Photoemission (TR-2PPE), http://www.lip.physik.unl-essen.de/aeschlimann/2y_photo.htm, date unknown.

Lewis et al., Vibrational Dynamics of Molecular Overlayers on Metal Surfaces, Dept. of Chemistry, University of Pennsylvania, http://lorax.chem.upenn.edu/.molsurf/cucotalk/html, date unknown.

Rettner et al., Dynamics of the Cheimisorption of 02 on Pt(111): Dissociation via Direct Population of a Molecularly Chemisorbed Precursor at High Incidence Kinetic Energy, The Journal of Chemical Physics, vol. 94, Issue 2 (1991).

Friedman et al., SiGe/Si THz Laser Based on Transitions Between Inverted Mass Light-Hole and Heavy Hole Standards, Applied Physics Letters, vol. 78, No. 4 (2001).

Harrison et al., Population -Inversion and Gain Estimates for a Semiconductor TASER, date unknown.

Harrison et al., Theoretical Studies of Subband Carrier Lifetimes n an Optically Pumped Three-Level-Terahertz Laser, Superlattices and Microstructures, vol. 23, No. 2 (1998).

Harrison et al., Room Temperature Population Inversion in SIGe TASER Designs, IMP, School of Electronic and Electrical Engineering, The University of Leeds, date unknown.

Sun et al., Pheonon-Pumped Terhertz Gain in n-Type GaAs/AlGaAs Superlattices, Applied Physic Letters, vol. 7; No. 22 (2001).

Altukhov et al., Towards Si1-xGex Quantum-Well Resonant-State Terahertz Laser, Applied Physics Letters, vol. 79, No. 24 (2001).

Sun et al., Intersubband Lasing Lifetimes of SIGe/Si and GaAs/AlGaAs Multiple Quantum Well Structures, Applied Physics Letters, vol. 66, No. 25 (1995).

Sun et al., Phonon Pumped SIGe/SI Interminiband Terahertz Laser, date unknown.

Soref et al., Terhertz Gain in a SIGe/Si Quantum Starcase Utilizing the Heavy-Hole Inverted Effective Mass, Applied Physics Letters, vol. 79, No. 22 (2001).

Aeschlimann et al., Competing Nonradative Channels for Hot Electroni Induced Surface Photochemistry, Chemical Physics 202, 127-141 (1996).

Auerbach, Daniel J., Hitting the Surface-Softly, Science, vo. 294, pp. 2488-2489 (2001).

Badescu et al., Energetics and Vibrational States for Hydrogen on Pt(111), Physical Review Letters, vol. 88, No. 13 (2002).

Balandin et al., Effect of Phonon Confinement on the Thermoelectric Figure of Merit of Quantum Wells, Journal of Applied Physics, vol. 84, No. 11 (1998).

Bartels et al., Coherent Zone-Folded Longitudinal Acoustic Phonons in Semiconductor Superlattics: Excitation and Detection, Physical Review Letters, vol. 82, No. 5 (1999).

Baumberg et al., Ultrafast Acoustic Phonon Ballistics in Semiconductor Heterostructures, Physical Review Letters, vol. 78, No. 17 (1997).

Bedurftig et al., Vibrational and Structural Properties of OH Adsorbed on Pt(111), Journal of Chemical Physics, vol. 111, No. 24 (1999).

Valden et al., Onset of Catalytic Activity of Gold Clusters on Titania with the Appearance on Nonmetallic Properties, Science, vol. 281 (1998).

Bondzie et al., Oxygen Adsorption on Well-Defined Gold Particles on TIO2(110), J. Vac. Sci. Technol. A17(4) (1999).

Bezani et al., Intersubband Relaxation Leletimes in p-GaAs/AlGaAs Quantum Wells Below theLO-Ohonon Energy Measured in a Free Electron Laser Experiment, Semicond. Sci. Technol. 14 (1999).

Brako et al., Interaction of CO Molecules Adsorbed on Metal Surfaces, Vacuum 61, 89-93 (2001).

Burgi et al., Confinement of Surface State Electronis in Fabry-Perot Resonators, Physical Review Letters, vol. 61, No. 24 (1998).

Burgi et al., Probing Hot-Electron Dynamics at Surfaces with a Cold Scanning Tunneling Microscope, Physical Review Letters, vol. 82, No. 22 (1999).

Chang, Y.M., Interaction of Electron and Hold Plasma with Coherent Longitudinal Optical Phonons in GaAs, Applied Physics Letter, vol. 80, No. 14 (2002).

Chang et al., Observation of Coherent Surface Optical Phonon Oscillations by Time-Resolved Surface Second-Harmonic Generation, Physical Review Letters, vol. 78, No. 24 (1997).

Chang et al., Coherent Phonon Spectroscopy of GaAs Surfaces Using Time-Resolved Second-Harmonic Generation, Chemical Physcis 251, 283-308 (2000).

Chang et al. Observation of Local-Interfacial Optical Phonons at Buried Interfaces Using Time-Resolved Second Harmonic Generation, Physical Review B, vol. 59, No. 19 (1999).

Chen et al., Stimulate-Emission-Induced Enhancement of the Decay Rate of Longitudinal Optical Phonons in III-V Semiconductors; Applied Physics Letters, vol. 80, No. 16 (2002).

Corcelli et al., Vibrational Energy Pooling in CO on NaCl(100): Methods, Journal of Chemical Physics, vol. 116, No. 18 (2002).

Fierz et al., Time-Resolved 2-Photon Photolonization on Metallic Nanoparticles, Appl. Phys. B 68 (1999); http://www.ilp.physik.uni-essen.de/aeschllman/abstract.htm#6.

Harrison et al., Maximising the Population Inversion, by Optimizing the Depopulation Rate, in Far-Infared Quantum Cascade Lasers (2001).

Harrison et al., The Carrier Dynamics of Terahertz Intersubband Lasers, Some Publishing Company, (1999).

Cummings et al., Ultrafast Impulsive Excitation of Coherent Longitudinal Acoustic Phonon Oscillations in Highly Potoexcited InSb, Applied Physics Letters, vol. 79, No. 6 (2001).

Chiang, T.C., Photoemission Studies of Quantum Well States In Thin Films, Surface Science Reports 39, pp. 181-235 (2000).

Debernardi et al., Anharmonic Phonon Lifetimes in Semiconductors from Density-Functional Perturbation Theory, Physical Review Letters, vol. 75, No. 9 (1995).

Davis et al., Kinetics and Dynamics of the Dissociative Chemisorption of Oxygen on Ir(111), J. Chem. Phys. 109 (3) (1997).

Choi et al., Ultrafast Carrier Dynamics in a Highly Excited GaN Epilayer, Physical Review B., Vo. 63, 115315 (2001).

Diekhoner et al., Parallel Pathways in Methanol Decomposition on PT(111), Surface Science 409, pp. 384-391 (1998).

Demidenko et al., Piezoelectrically Active Acoustic Waves Confined in a Quantum Well and Their Amplification by electron Drift, Semiconductor Physics, Quantum Electronics & Optoelectronis, vol. 3, No. 4, pp. 427-431 (2000).

de Paula et al., Carrier Capture via Confined Phonons in GaAs-AlGaAs Multiple Quantum Wells, Seicond, Sci. Technol, 9, pp. 730-732 (1994).

Demidenko et al., Amplification of Localized Acoustic Waves by the Electron Drift in a Quantum Well, Semiconductor Physics, Quantum Electronics & Optoelectronics, vol. 2, No. 1, pp. 11-24 (1999).

Demidenko et al., Generation of Coherent Confined Acoustic Phonons by Drifting Electrons in Quantum Wire; Semiconductor Physics, Quantum Electronics & Optoelectronics, vol. 3, No. 4, pp. 432-437 (2000).

Denzler et al., Surface Femtochemistry: Ultrafast Reaction Dynamics Driven by Hot Electron Mediated Reaction Pathways, World Scientific (2001).

Fatti et al., Temperature-Dependent Electron-lattice Thermalization in GaAs, Physical Review B, vol. 59, No. 7 (1999).

Anastassakis et al., The Physics of Semiconductors, vol. 2, World Scientific (1990).

de Paula et al., Carrier Capture Processes in Semiconductor Superlattices due to Emission of confined Phonons, J. Appl. Phys. 77 (12) (1995).

Engstrom et al., Comparing the Vibrational Properties of Low-Energy Modes of a Molecular and an Atomic Adsorbate: CO and O on Pt(111), Journal of Chemical Physics, vol. 112, No. 4 (2000).

Glavin et al., Generation of High-Frequency Coherent Acoustic Phonons in a Weakly Coupled Superlattice, Applied Physics Letters, vol. 74, No. 23 (1999).

Ermoshin et al., Vibrational Energy Relaxation of Adsorbate Vibrations: A theoretical Study of the H/SI(111) System, J. Chem. Phys. 105 (20) (1996.

Glavin et al., Acoustic Phonon Generation In A Superlattice Under the Hopping Perpendicular Transport, United Nations Educational Scientific and Cultural Organization and International Atomic Energy Agency (1998).

Gergen et al., Chemically Induced Electronic Excitations at Metal Surfaces, Science, vol. 294 (2001).

Hagston et al., Simplified Treatment of Scattering Processes in Quantum Will Structures, Journal of Applied Physics, vol. 90, No. 3 (2001).

Harrison et al., Population-Inversion and Gain Estimates for a Semiconducor Taser, date unknown.

Hess et al., Hot Carrier Relaxation by Extreme Electron-LO Phonon Scattering in GaN, date unknown.

Hohlfeld et al., Electron and Lattice Dynamics Following Optical Excitation of Metals, Chemical Physics 251, pp. 237-258 (2000).

Huang et al., Vibrational Promotion of Electron Transfer, Science, vol. 290 (2000).

Kawakami et al., Quantum-well States In Cooper Thin Films, Nature, vol. 398 (1999).

Kohler et al., Enhanced Electron-Phonon Coupling at the Mo and W (110) Surfaces Induced by Adsorbed Hydrogen, mtrl-th/9510004 (1995).

Lewis et al., Continuum Elastic Theory of Adsorbate Vibrational Relaxation, J. Chem. Phys. 108 (3) (1998).

Lewis et al., Controlling Adsorbate Bivrational Lifetimes Using Superlattices, Physical Review B, vol. 63, 085402 (2001).

Komirenko, Sergly M., Phonons and Phonon-Related Effects In Prospective Nanoscale Semiconductor Devices (2000).

Huang et al., Observation of Vibrational Excitation and Deexcitation of NO(v=2) Scattering from Au(111):Evidence for Electron-Hole-Pair Mediate Energy Transfer, Physical Review Letters, vol. 84, No. 13 (2000).

Lewis et al, Substrate-Adsorbate Coupling In Co-Adsorbed Copper, Physical Review Letters, vol. 77, No. 26 (1996).

Krauss et al., Coherent Acoustic Phonons in a Semiconductor Quantum Dot, Physical Review Letters, vol. 79, No. 25 (1997).

Lugli et al., Interaction of Electrons with Interface Phonons in GaAs/AlAs and GaAs/AlGaAs Heterostructures,Semicond. Sci. Technol. 7 (1992).

Nienhaus et al., Electron-Hole Pair Creation at Ag and Cu Surfaces by Adsorption of Atomic Hydrogen and Deuterium, Physical Review Letters, vol. 82, No. 2 (1999).

Mulet et al., Nanoscale Radiative Heat Transfer Between a Small Particle and a Plane Surface, Applied Physics Letters, vol. 78, No. 19 (2001).

Nienhaus et al., Direct Detection of Electron-Hole Pairs Generated by Chemical Reactions on Metal Surfaces, Surface Science 445, pp. 335-342 (2000).

Nienhaus, Hermann, Electronic Excitations by Chemical Reactions on Metal Surfaces, Surface Science Reports 45, pp. 1-78 (2002).

Nolan et al., Transitional Energy selection of Molecular Precursors to Oxygen Adsorption on Pt(111), Physical Review Letters, vol. 81, No. 15 (1998).

Nienhaus et al., Selective H Atom Sensors Using Ultrathin Ag/Sl Schottky Diodes, Applied Physics Letters, vol. 74, No. 26 (1999).

Nolan et al., Molecularly Chemisorbed Intermediates to Oxygen Adsorption on Pt(111): A Molecular Beam and Electron Energy-Loss Spectroscopy Study, Journal of Chemical Physics, vol. 111, No. 8 (1999).

Nolan et al., Direct Verification of a High-Translational-Energy Molecular Precursor to Oxygen Dissociation on Pd(111), Surface Science 419 (1998).

Ogawa et al., Optical Intersubband Transitions and Femtosecond Dynamics in Ag/Fe(100) Quantum Wells, Physical Review Letters, vol. 68, No. 11 (2002).

Plihal et al., Role of Intra-Adsorbate Coulomb Correlations in Energy Transfer at Metal Surfaces, Physical Review B, vol. 58, No. 4 (1998).

Paggel et al., Quantum-Well States as Fabry-Perot Modes in a Thin-Flim Electron Interferometer, Science, vol. 283 (1999).

Paggel et al., Quasiparticles Lifetime In Macroscopically Uniform Ag/Fe(100) Quantum Wells, Physical Review Letters, vol. 81, No. 25 (1998).

Paggel et al., Quantum Well Photoemission from Atomically Uniform Ag Films: Determination of Electronic Band Structure and Quasi-Particle Lifetime in Ag(100) Applied Surface Science 162-163, pp. 78-85 (2000).

Persson et al., A First-Principles Potential Energy Surface for Eley-Rideal Reaction Dynamics of H Atoms on Cu(111), Journal of Chemical Physics, vol. 110, No. 4 (1999).

Ozgur et al., Control of Coherent Acoustic Phonons In InGaN Multiple Quantum Wells, arXlv:cond-mat/0010170 (2000).

Stanton et al., Energy Relaxation by Hot Electrons In n-GaN Epilayers, Journal of Applied Physics, vol. 89, No. 2 (2001).

Stipe et al., Atomistic Studies of O2 Dissociation on Pt(111) Induced by Photons, Electrons and by Heating, J. Chem. Phys. 107 (16) (1997).

Qu et al., Long-Lived Phonons, Physical Review B, vol. 48, No. 9 (1993).

Pontius, et al., Size-Dependent Hot-Electron Dynamics in Small Pdn-Clusters, Journal of Chemical Physics, vol. 115, No. 22 (2001).

Smit et al., Enhanced Tunneling-Across Nanometer-Scale Metal-Semiconductor Interfaces, Applied Physics Letters, vol. 80, No. 14 (2002).

Qiu et al., Long-Distance and Damping of Low-Frequency Phonon Polariton in LiNbO3, Physical Review B, vol. 56, No. 10 (1997).

Rousse et al, Non-Thermal Melting In Semiconductors Measured at Femtosecond Resolution, Nature, vol. 410 (2001).

Schelling et al., Phonon Wave-Packet Dynamics at Semiconductor Interfaces by Molecular-Dynamics Simulation, Applied Physics Letters, vol. 80, No. 14 (2002).

Shikin et al., Phase Accumulation Model Analysis of Quantum Well Resonances Formed in Ultra-Thin Ag, Au Films on W(110), Surface Science (2001).

Snow et al., Ultrathin PtSi Layers Paterned by Scanned Probe Lithography, Applied Physics Letters, vol. 79, No. 8 (2001).

Prabhu et al., Femtosecond Energy Relaxation of Nonthermal Electrons Injected in p-doped GaAs Base of a Heterojunction Bipolar Transistor, Journal of Applied Physics, vol. 90, No. 1 (2001).

Tsai et al., Theoretical Modeling of Nonequllibrium Optical Phonons and Electron Energy Relaxation In GaN, Journal of Applied Physics, vol. 85, No. 3 (1999).

Tripa et al., Surface-Aligned Photochemistry: Aiming Reactive Oxygen Atoms Along a Single Crystal Surface, Journal of Chemical Physics, vol. 112, No. 5 (2000).

Tripa et al., Surface-Aligned Reaction of Photogenerated Oxygen Atoms with Carbon Monoxide Targets, Nature; vol. 398 (1999).

Tripa et al., Kinetics Measurements of CO Photo-Oxidation on Pt(111), J. Chem. Phys. 105 (4) (1996).

Taylor et al., Strong Electron-LO Phonon Scattering and Hot Carrier Relaxatin In GaN, Abstract No. ha249KW3, date unknown.

Tom et al., Coherent Phonon and Electron Spectroscopy on Surfaces Using Time-Resolved Second-Harmonic Generation, date unknown.

Tiusan et al., Quantum Coherent Transport Versus Diode-Like Effect in Semiconductor-Free Metal/Insulator Structure, Applied Physics Letters, vol. 79, No. 25 (2001).

Stromquist et al., The Dynamics of H Absorption in and Adsorption on Cu(111), Surface Science 397, pp. 382-394 (1998).

Weber et al., Carrier Capture Processes In GaAs-AlGaAs Quantum Wells Due to Emission of Confined Phonons, Appl. Phys. Lett, 63 (22) (1993).

Wintterlin et al., Atomic and Macroscopic Reaction Rates of a Surface-Catalyzed Reaction, Science, vol. 278 (1997).

Yeo et al., Calorimetric HEats for CO and Oxygen Adsorption end for the Catalytic CO Oxidation Reaction on Pt(111), J. Chem. Phys. 106 (1) (1997).

Witte et al., Low Frequency Vibrational Modes of Adsorbates, Surface Science, No. 1362 (2002).

Xu et al., Electrical Generation of Terahertz Electromagnetic Pulses by Hot-Electrons in Quantum Wells, Superlattices and Microstructures, vol. 22, No. 1 (1997).

Wanke et al., Injectorless Quantum-Cascade Lasers, Applied Physics Letters, vol. 78, No. 25 (2001).

Zhdanov, Vladimir P., Nm-Sized Metal Particles on a Semiconductor Surface, Schottky Model, etc., Surface Science, SUSC 2931 (2002).

Zambelli et al., Complex Pathways in Dissociative Adsorption of Oxygen on Platinum, Naure, vol. 390 (1997).

Zhdanov et al., Substrate-Mediated Photoinduced Chemical Reactions on Ultrathin Metal Films, Surface Science 432 (1999).

Albano et al., Adsorption-Kinetics of Hot Dimers, SciSearch Databaseof the Institute for Scientific Information (1999).

Casassa et al., Time-Resolved Measurements of Vibrational Relaxatin of Molecules on surfaces: Hydroxyl Groups on Silica Surfaces, Journal of Vacuum Science & Technology A; Vacuum, Surfaces, and Films, vol. 3, Issue 3 (1985).

Cavanagh et al., Vibrational Relaxation of Adsorbed Molecules: Comparison with Relaxation Rates of Model Compounds, Journal of Vacuum Science & Technology A: Vacuum, Surfaces and Films, vol. 5, Issue 4 (1987).

Hyh et al., Methanol Oxidation of Palladium Compared to Rhodium at Ambient Pressures as Probed by Surface-Enhanced Raman and Mass Spectroscopies, Journal of Catalysis, vol. 174 (2) (1998).

Gumhalter et al., Effect of Electronic Relaxation on Covalent Adsorption Reaction Rates, Physical Review B, vol. 30, Issue 6 (1984).

Nolan et al., Surface Science, Direct Verification of a High-Translational-Energy Molecular Precursor to Oxygen Dissociation on Pd(111), Surface Science, vol. 419 (1998).

Tully et al., Electronic and Phonon Mechanisms of vibrational Relaxation: CO or Cu(100), J. Vac. Sci. Technol. A 11(4) (1993).

Dimatteo et al., Enhanced Photogeneration of Carriers in a Semiconductor Via Coupling Across a Nonisothermal Nonascale Vacuum Gap, Applied Physics Letters, vol. 79, Issue 12 (2001).

Yates et al., Special Adsorption and Reaction Effects at Step Defect Sites on Platinum Single Crystal Surfaces (2000).

Dekorsy et al, Coherent Acoustic Phons in Semiconductor Superlattics, phys. stat. sp;. (b) 215, p. 425-430 (1999).

Boulter, James; "Laboratory Measurement of OH . . . "; http://pearll.lanl.gov/wsa2002/WSA2002talks.pdf, date unknown.

Chubb, D. L., et al; "Semiconductor Silicon as a Selective Emitter"; http://www.thermopv.org/TPV5-2-05-Chubb.pdf (abstract only), date unknown.

Danese, A., et al.; "Influence of the substrate electronic structure on metallic quantum well . . . "; Prog. Surf. Sci., 67, (2001), pp. 249-258.

Diesing, D., et al.; "Aluminium oxide tunnel junctions . . . "; Thin Solid Films, vol. 342 (1-2) (1999) pp. 282-290.

Dimatteo, R. S., et al.; "Introduction to and Experimental Demonstration of Micron-gap ThermoPhoto Voltalcs"; http://www.thermopv.org/37DiMatteo.html (abstract only), date unknown.

Dogwiler, Urs, et al.; "Two-dimensional . . . catalytically stabilized . . . lean methane-air . . . "; Combustion and Flame, (1999), 116(1,2), pp. 243-258.

Echenique, P. M., et al.; "Surface-state electron dynamics in noble metals"; Prog. Surf. Sci., 67, (2001), pp. 271-283.

Endo, Makoto, et al.; "Oxidation of methanol . . . "; Surf. Sci. 441 ( 1999) L931-L937, Surf. Sci. Letters.

Fan, C.Y., et al.; "The oxidation of CO on RuO2 . . . "; J. Chem. Phys. 114, (2001), pp. 10058-10062.

Gee, Adam T., et al.; "The dynamics of O2 adsorption on Pt(533) . . . "; J. Chem. Phys.(2000) 113, pp. 10333-10343.

Guliants, Elena A, et al.; "A. 0.5-μm -thick polycrystalline silicon Schottky . . . "; Appl. Phys. Let., (2002), 80, pp. 1474-1476.

Halonen, Lauri, et al.; "Reactivity of vibrationally excited methane on nickel . . . "; J. Chem. Phys.(2001) 115, pp. 5611-5619.

Hasegawa, Y., et al.; Modification of electron . . . standing wave . . . Pd . . . ; Surf. Sci., in press, Apr. 11, 2002.

Henry, Claude R.; "Catalytic activity . . . nanometer-sized metal clusters"; Applied Surf. Sci., 164, (2000) pp. 252-259.

Ho, Wilson; http://www.lassp.cornell.edu/lassp_data/wilsonho.html, date unknown.

Honkala, Karollina, et al.; "Ab initio study of O2 precursor states on the Pd(111) . . . "; J. Chem. Phys. (2001) 115, pp. 2297-2302.

Hou, H. ; Y., et al.; "Chemical Interactions of Super-Excited Molecules on Metal Surfaces"; http://www.2.chem.ucsb.edu/-wodtke/papers/danl.pdf, date unknown.

Hou, H., et al.; "Direct multiquantum relaxation of highly vibrationally excited NO . . . "; J. Chem. Phys., 110, (1999) pp. 10660-10663.

IBH; "NanoLED overview"; http://www.ibh.co.uk/products/light_sources/nanoled_main.htm, date unknown.

IBH; "Red picosecond laser sources"; http://www.ibh.co.uk/products/light_sources/nanoled/heads/red_laser_heads.htm, date unknown.

Iftimia, Ileana, et al.; "Theory . . . scattering of molecules from surface"; Phys. Rev. B (2002) 65, Article 125401.

Ishikawa, Yasuyuki, et al.; "Energetics of H2O dissociation and COads+OHads reactions . . . Pt. . . "; Surf. Sci. preprints SUSC 12830, Apr. 27, 2002.

Johnson, R. Colin ; "Molecular substitution . . . terahertz switch arrays"; EE Times, (Apr. 10, 2000, 3:35 p.m. EST) http://www.cct.com/story/OBG20000410S0057.

Kao, Chia-Ling, et al.; "The adsorption . . . molecular carbon dioxide on Pt(111) and Pd(111)"; Surf. Sci., (2001) Article 12570.

Katz, Gil, et al.; "Non-Adiabatic Charge Transfer Process of Oxygen on metal Surfaces"; Surf. Sci. 425(1) (1999) pp. 1-14.

Komeda, T., et al.; "Lateral Hopping of Molecules Induced by Excitation of Internal Vibration . . . "; Science, 295, (2002) pp. 2055-2058.

Li, Shenping, et al.; "Generation of wavelength-tunable single-mode picosecond pulses . . . "; Appl. Phys. Let. 76, (2000) pp. 3676-3678.

Mitsui, T., et al.; "Coadsorption and Interactions of O and H on Pd(111)"; Surf. Sci., Article 12767, (2002).

Moula, Md. Golam, et al.; "Velocity distribution of desorbing CO2 in CO oxidation on Pd(110) . . . "; Applied Surf. Sci., 169-170, pp. 268-272 (2001).

Nienhaus, Hermann; "Electron-hole pair creation by reactions at metal surfaces"; APS, Mar. 20-26, 1999, Atlanta, GA, Session SC33 [SC33.01].

Rinnemo, Mats; "Catalytic Ignition and Kinetic Phase Transitions"; 1996; http://www.2.lib.chalmers.se/oth/diss/doc/9596/RianemoMats.html.

Robertson, A. J. B.; "Catalysis of Gas Reactions by Metals"; Logos Press Limited; 1970; LC # 79-80936; pp. 1-5, 10, 41; Great Britain, Adlard & son Ltd.

Schewe, P., et al.; "CO2 Production at the Single-Molecule Level"; http://www.aip.org/enews/physnews/2001/split/561-1.html.

Sheng, H., et al.; "Schottky diode with Ag on (110) epitaxial ZnO film"; Appl. Phys. Let. (2002) 80, pp. 2132-2134.

Sun, C.-K., et al.; "Femtosecond studies of carrier dynamics in InGaN"; Appl. Phys. Let. (1997) 70 pp. 2004-2006.

Svensson, K., et al.; "Dipole Active Vibrational Motion In the Physisorption Well"; Phys. Rev. Lett., 78, (1997) pp. 2016-2019.

Tarver, Craig M.; "Non-Equilibrium Chemical Kinetic . . . Explosive Reactive Flows"; Fall 1999 IMA Workshop: High-Speed Combustion in Gaseous and Condensed-Phase.

Teodorescu, C.M., et al.; "Structure of Fe layers grown on InAs . . . "; Appl. Surf. Sci., 166, (2000) pp. 137-142.

Volkening, S., et al.; "CO oxidation on PT(III)—Scanning tunneling microscopy experiments . . . "; J. Chem. Phys. (2001) 114, pp. 6382-6395.

Watson, D.T.P., et al.; "Isothermal and temperature-programmed oxidation of CH over Pt . . . "; Surf. Sci. preprint, year 2001.

Watson, D.T.P., et al.; "Surface products of the dissociative adsorption of methane on Pt . . . "; Surf. Sci. preprint, c. Oct. 2001.

Wilkh, Steffen, et al.; "Theoretical investigation of water formation on Rh and Pt Surfaces"; J. Chem. Phys., 112, (2000) pp. 9986-9995.

Wintterlin, J, R., et al.; "Existence of a "Hot" Atom Mechanism for the Dissociation of O2 on Pt(222)"; Phys. Rev. Lett., 77, (1996), pp. 123-126.

Zhukov, V. P., et al.; "Lifetimes of quasiparticle excitations in 4d transition metals . . . "; Phys. Rev. B (2002) 65, Article 115116.

Ree, J. et al., "Dynamics of Gas-Surface Interactions: Reaction of Atomic Oxygen with Chemisorbed Hydrogen on Tungsten," Journal of Physical Chemistry, vol. 101 (#25), pp. 4523-4534, Jun. 19, 1997.

Ree, J. et al., "Reaction of atomic oxygen with adsorbed carbon monoxide on a platinum surface," Journal of Chemical Physics, vol. 104, Issue 2, pp. 742-757, Jan. 8, 1996.

Murphy, M. J. et al., "Inverted vibrational distributions from N2 recombination at Ru(001): Evidence for a metastable molecular chemisorption well," Journal of Chemical Physics, vol. 110, No. 14, pp. 6954-6962, Apr. 8, 1999.

Kim, M. S. et al., "Reaction of Gas-Phase Atomic Hydrogen with Chemisorbed Hydrogen Atoms on an Iron Surface," Bull. Korean Chem. Soc., vol. 18, No. 9, pp. 985-994, May 22, 1997.

Bonn, M. et al., "Phonon-Versus Electron-Mediated Desorption and Oxidation of CO on Ru(0001)," Science, vol. 285, pp. 1042-1045, Aug. 13, 1999. www.sciencemag.org.

Shin HK, "Vibrationally excited OD Radicals from the Reaction of Oxygen-Atoms with Chemisorbed Deuterium on Tungsten," Journals of Physical Chemistry, vol. 102(#13), pp. 2372-2380, Mar. 26, 1998.

G.H. Takaoka et al., "Preparation and catalytic activity of nanoscale Au islands supported on Ti02", Nuclear Instruments & Methods in Physics Research, Section-B: Beam Interactions with Materials and Atoms, North-Holland Publishing Company, Amsterdam, NL, vol. 121, No. 1, 1997, pp. 503-506, XP004057973, abstract.

P. Avouris et al., "Electron-Stimulated Catalysis Device", IBM Technical Disclosure Bulletin, vol. 25, No. 12, May 1, 1983, pp. 6378-6379, New York, US, XP002219954.

Frese, et al., "Analysis of Current/Voltage Curves at n-Si/SiO$_2$ /Pt Electrodes", J. Electrochem. Soc., Dec. 1994, pp. 3375-3382, vol. 141, No. 12, The Electrochemical Society, Inc.

Frese, et al., "Methanol Oxidation at p-Si/Pt Electrodes, Evidence for Hot Hole Reactivity", J. Phys. Chem., 1995, pp. 6074-6083, vol. 99, American Chemical Society.

Gadzuk, "Multiple Electron Processes in Hot-Electron Femtochemistry at Surfaces", http://www.csti.nist.gov/div837/837.03/highlite/gadzuk1999.htm.

Frese, et al., "Hot Electron Reduction at Etched n-Si/Pt Thin Film Electrodes", J. Electrochem. Soc., Sep. 1994, pp. 2402-2409, vol. 103, The Electrochemical Society Inc.

Gaillard, et al., "Hot Electron Generation in Aqueous Solution at Oxide-Covered Tantalum Electrodes, Reduction of Methylpyridinium and Electrogenerated Chemiluminescence of $Ru(bpy)_3^{2+}$", J. Phys. Chem., 1999, pp. 667-674, vol. 103, American Chemical Society.

Sung, et al., "Demonstration of Electrochemical Generation of Solution-Phase Hot Electrons at Oxide-Covered Tantalum Electrodes by Direct Electrogenerated Chemiluminescence", J. Phys. Chem., 1998, pp. 9797-9805, vol. 102, American Chemical Society.

Mahan, G. D. et al., "Multilayer thermionic refrigerator and generator," Journal of Applied Physics, vol. 83, No. 9, May 1, 1998.

Gadzuk, J. W., "Hot-electron femtochemistry at surfaces: on the role of multiple electron processes in desorption," Chemical Physics, vol. 251, year 2000, pp. 87-97.

Gadzuk, J. W., "Resonance-assisted hot electron fetochemistry at surfaces," Physical Review Letters, May 27, 1996, vol. 76, Issue 22, pp. 4234-4237.

GE, N.-H. et al., "Femtosecond Dynamics of Electron Localization at Interfaces," Science, vol. 279, No. 5348, Issue of Jan. 9, 1998, pp. 202-205.

Gao, Shiwu, "Quantum kinetic theory of vibrational heating and bond breaking by hot electrons," Physical Review B, vol. 55, No. 3, Jan. 15, 1997-I, pp. 1876-1886.

Hou, H. et al., "Enhanced Reactivity of Highly Vibrationally Excited Molecules on Metal Surfaces," Science, vol. 284, No. 5420, Issue of 4 Jun. 1999, p. 1647-1650.

Otto, Andreas et al., "Role of atomic scale roughness in hot electron chemistry," Journal of Physical Chemistry B, vol. 103, No. 14, Apr. 8, 1999, pp. 2696-2701.

Sung, Yung-Eun et al., "Enhancement of electrochemical hot electron injection into electrolyte solutions at oxide-covered tantalum electrodes by thin platinum films," Journal of Physical Chemistry B., vol. 102, No. 49, Dec. 3, 1998, pp. 9806-9811.

Agranovich, V. M. et al., "New concept for organic LEDs: non-radiative electronic energy transfer from semiconductor quantum well to organic overlayer", Elsevier Science, Synthetic Metals, 2001, vol. 116, pp. 349-351.

Achermann, M. et al., "Carrier dynamics around nano-scale Schottky contacts: a femtosecond near-field study", Applied Surface Science 7659 (2002) 1-4.

Aeschlimann, M. et al., "Ultrafast electron dynamics in metals", The Ultrafast Surface Science Group, http://www.ilp.physik.uni-essen.de/aeschlimann/2y_photo.htm (date unknown).

Auerbach, D. et al., "Reagent Vibrational Excitation: A Key to Understanding Chemical Dynamics at Surfaces?", abstract only. (date unknown).

Balandin, A. et al., "Significant decrease of the lattice thermal conductivity due to phonon confinement in a free-standing semiconductor quantum well", Physical Review B, Jul. 15, 1998; vol. 58, Issue 3, pp. 1545-1549.

Chen, -C. et al., "Hot electron reduction at n-Si/An thin film electrodes", Journal-of-the-Electrochemical-Society, vol. 139, Nov. 1992, pp. 3243-3249.

Diesing, D. et al., "Surface reactions with hot electrons and hot holes in metals", Surface Science, 331-333, 1995, pp. 289-293.

Driskill-Smith, A. A. G. et al., "The "nanotriode:" A nanoscale field-emission tube", Applied Physics Letters, Nov. 1, 1999, vol. 75, Issue 18, pp. 2845-2847.

Gadzuk, J. W., "Resonance-assisted hot electron femtochemistry at surfaces", Physical Review Letters, May 27, 1996, vol. 76, Issue 22, pp. 4234-4237.

Gadzuk, J. W., "Surface Femotochemistry with Fast Lasers and Slow Nanostructures", http://www.cstl.nist.gov/div837/837.03/highlite/previous/dietmim.htm (date inknown).

Guo, J. et al., "The desorption yield dependence on wavelength of femtosecond laser from CO/Cu(111)", Annual Meeting of the American Physical Society, Mar. 1999, Atlanta, GA; Session BC18-Surfaces(General), ORAL session, Mar. 21; Room 258W, GWCC [BC18.06].

Hofer, U., "Self-Trapping of Electrons at Surfaces", Science, vol. 279, No. 5348, Issue of 9 Jan. 1998, pp. 190-191.

Katz, G. et al., "A theoretical study of hole induced desorption", Journal of Chemical Physics, Oct. 22, 1999, vol. 111, Issue 16, pp. 7593-7598.

Lee, B.C. et al., "Transmission of longitudinal optical phonons through a barrier in uniaxial crystals", Physical Review B, vol. 65, 153315, Apr. 15, 2002.

NANOLITE, "NANOLITE Sparkflashlamp", http://www.hsps.com/products/nanolaen.htm (date unknown).

Prybyla, J. A. et al., "Femtosecond time-resolved surface reaction: Desorption of CO from Cu(111) in <325 fsec", Physical Review Letters, Jan. 27, 1992, vol. 68, Issue 4, pp. 503-506.

Saalfrank, P. et al., "Quantum dynamics of bond breaking in a dissipative environment: Indirect and direct photodesorption of neutrals from metals", J. Chem. Phys. 105 (6), Aug. 8, 1996, pp. 2441-2454.

White, J. M., "Using photons and eletrons to drive surface chemical reactions", Journal of Molecular Catalysis A: Chemical 131, 1998, pp. 71-90.

Zhu, X.-Y., "Surface photochemistry: from hot reactions to hot materials", Surface Science, vol. 390, (1997), pp. 224-236.

Xiaofeng, Fan, Gehong, Chris Labounty, and Bowers, John E., Croke, Edward, Ahn, Channing C., Huxtable, Scott, Majumdar, Arun, Shakouri, Ali; SiGec/Si superlattice microcoolers; Applied Phuscis Letters, vol. 78, No. 11, Mar. 12, 2001, pp. 1580-1582.

Jongma, Rienk T., Wodtke, Alec M.; Fast multiquantum vibrational relaxation of highly vibrationally excited O2; Journal of Chemical Physics; vol. 111, No. 24; Dec. 22 1999; pp. 10957-10963.

H. Park et al., "Nanomechanical oscillations in a single-C60 transistor", Letters to nature, vol. 407, Sep. 7, 2000, www.nature.com, pp. 57-60.

R.D. Vale et al., "The Way Things Move: Looking Under the Hood of Molecular Motor Proteins", Science, vol. 288, Apr. 7, 2000, www.sciencemag.org, pp. 88-95.

P. Armour et al., "Hot-electron transmission through metal-metal interfaces: a study of Au/Fe/Au trilayers in GaAs substrates", Applied Surface Science 123/124 (1998), pp. 412-417.

I. Campillo et al., "inelastic lifetimes of hot electrons in real metals", Physical Review Letters, vol. 83, No. 11, Sep. 13, 1999, pp. 2230-2233.

Influence of Metal Thickness to Sensitivity of Pt/GaN Schottky Diodes For Gas Sensing Applications; V.Tilak, M.Ali, V.Cimalla, V.Manivannan, P.Sandvik, J.Fedison, O.Ambacher and D.Merfeld; Materials Research Society, vol. 798 2004.

Prieur et al., "Sound Amplification by Stimulated Emission of Radiation in an Amorphous Compound," Europhysics letters, 24 (5) (1993), pp. 409-414.

Zavtrok et al., "SASER (Sound Amplification by Stimulated Emission of Radiation)," Apr. 1997, pp. 406-414.

Surowiak et al., "Structure and Certain Physical Properties of BaTiO3 Thin Films with Diffused Phase Transition," XP-002355326, 1 page (date not available).

Taylor et al., "Phonon Focusing in Solids," Jun. 1969, pp. 416-420.

Tobias et al., "Fast chemical Sensing with Metal-insulator Silicon Carbide Structures," Jun. 1997, pp. 287-289.

Lloyd Spetz et al., "High Temperature Sensors Based on Metal-Insulator-Silicon Carbide Devices," Jan. 1997, pp. 493-511.

Benson, "Sodium chemiluminescence in the Na+N2O and Na-catalyzed N2O+CO Reactions," Sep. 1976, pp. 3879-3885.

\* cited by examiner

DIODE ENERGY CONVERTER FOR CHEMICAL KINETIC ELECTRON ENERGY TRANSFER

REFERENCE TO CROSS-RELATED APPLICATIONS

This is a continuation-in-part application of U.S. patent application Ser. No. 10/038,257, filed Oct. 24, 2001, now U.S. Pat. No. 6,700,056 which is a continuation of U.S. patent application Ser. No. 09/589,669 filed Jun. 7, 2000 now U.S. Pat. No. 6,327,859, which is a divisional of U.S. patent application Ser. No. 09/304,979 filed May 4, 1999 now U.S. Pat. No. 6,114,620.

FIELD

The present invention relates to the extraction of electrical or mechanical energy or coherent radiation from chemical reactions occurring on the surface of a catalyst before thermal equilibrium has been reached by the forms of the released energy.

BACKGROUND

Recent experimental observations have revealed clues to various catalytic processes occurring: 1) during the 0.01 picosecond time interval during which chemical reactants form bonds with the surface of a catalyst, causing the emission of charge carriers, such as electrons and holes; 2) during the picosecond time interval during which reactants adsorb and lose energy in quantum steps after becoming trapped at a potential well between an adsorbate and a catalyst surface, producing electronic friction, charge carrier currents and phonon emission; and 3) during the nanosecond and longer time intervals during which reaction intermediates and products radiate electromagnetic energy, either while trapped on a catalyst surface or immediately after escaping it. These processes entail three energy releasing processes, namely: 1) charge carrier emission (electrons and holes), 2) phonon emission and 3) photon emission.

The discovery of these pre-equilibrium emissions provides new pathways to convert the high grade chemical energy available during pre-equilibrium phases into useful work. The term "pre-equilibrium" refers to the period, however brief, during which the products of reactions have not yet come to thermal equilibrium. These products include energy emissions, such as charge carriers; high frequency phonons normally associated with the optical branch lattice vibrations and with acoustic branch vibrations of similar wavelength and energy; and excited state chemical product species.

Prior to the discovery of these rapid energy emission pathways, the energies resulting from a catalytic process, such as the heat of adsorption and the heat of formation, were considered to be heat associated with an equilibrium condition. Indeed, after tens of femtoseconds, emitted charge carriers have thermalized and after a few to hundreds of picoseconds, emitted phonons have thermalized.

SUMMARY

In an exemplary embodiment of the present invention, the emissions of charge carriers, such as electron-hole pairs, generated by chemical activity and reactions on or within catalyst surfaces, clusters or nanoclusters, are converted into electric potential. In an exemplary embodiment, semiconductor diodes such as p-n junctions and Schottky diodes formed between the catalyst and the semiconductors are used to carry out the conversion. The diodes are designed to collect ballistic charge carriers and can be Schottky diodes, pn junction diodes or diodes formed by various combinations of metal-semiconductor-oxide structures. The interlayer oxide thickness is preferably less than the particular ballistic mean free path associated with the energy loss of the appropriate charge carrier (e.g., hole or electron). The diodes are placed in contact with or near the catalyst nanolayer or nanocluster within a distance whose order of magnitude is less than approximately the mean free path of the appropriate ballistic charge carrier originating in the catalyst. In one embodiment, the diode is located adjacent to the catalyst cluster, while in a further embodiment, the diode is located under the catalyst, as a substrate.

The charge carriers travel ballistically over distances that can exceed the width of appropriately fabricated semiconductor junctions, similar to a thermionic effect. However, unlike the thermionic effect, the charge carriers in the case of the present invention need not have energy greater than the work function of the material involved. The charge carrier motion is trapped as a difference in fermi level, or chemical potential, between either side of the junction. The resulting voltage difference is indistinguishable from that of a photovoltaic collector. However, the charge carrier forces itself into the valence or conduction band and the circuit provides a counterpart hole or electron.

The present invention also provides devices and methods for converting the energy generated by catalytic reactions to mechanical motion before the energy thermalizes. In an exemplary embodiment, the converted motion is used to move a hydraulic fluid against a resisting pressure.

Recent advances in the art of quantum wells, atomically smooth superlattices and nanometer scale fabrication permit a degree of tailoring of the physical parameters to favor a particular reaction pathway (charge carrier, phonon, photon) or to enhance the efficiency of the energy collector.

The temperature of operation of a device in accordance with the present invention can be as low as hundreds of degrees Kelvin, which is much lower than the typical operational temperatures of conventional thermophotovoltaics and thermionic systems (1500 to 2500 Kelvin). Moreover, the power per mass and power per volume ultimately achievable using pre-equilibrium emissions in accordance with the present invention exceeds that of fuel cells, conventional thermo-photovoltaics, and conventional thermionic systems.

Furthermore, in comparison to fuel cells which require complex ducting, the devices of the present invention allow mixing of fuel and air in the same duct, thereby simplifying ducting requirements.

The combination of high volume and mass power density, simplicity, and lower temperature operation makes the methods and devices of the present invention competitive and uniquely useful.

DETAILED DESCRIPTION

Figure 1:
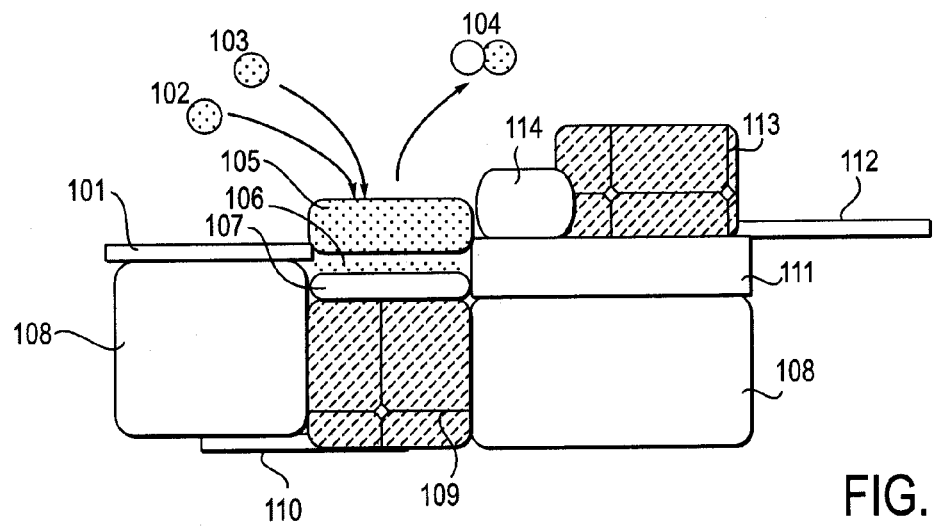
FIG. 1. shows a cross-section of an exemplary embodiment of a device for generating electricity in accordance with the present invention.

FIG. 1 shows a cross-sectional view of an exemplary embodiment of a device in accordance with the present invention. The device of FIG. 1, includes a catalyst 105 which is arranged on a top surface of the device to come into contact with oxidizer molecules 103 and fuel molecules 102. In the exemplary embodiment of FIG. 1, the catalyst 105 can be comprised of platinum or palladium, the oxidizer 103 can be comprised of air and the fuel 102 can be comprised of hydrogen or a reactant hydrocarbon such as methanol or ethanol. Exhaust molecules 104 result from the catalyzed reaction.

The exemplary device of FIG. 1 comprises a pair of Schottky diodes which act as charge carrier collectors, with one diode 113 being arranged on the top surface of the device, adjacent to the catalyst 105 (the "adjacent surface diode") and the other diode 109 being arranged in the substrate 108, below the catalyst (the "substrate diode"). An insulating layer 111 is arranged between the adjacent surface diode 113 and the substrate 108, as shown. The diodes 109 and 113 preferably comprise a bipolar semiconductor material such as InGaAsSb with a composition chosen to optimize the chosen operating conditions. For example, the second harmonic of a CO stretch vibration on a catalyst surface at 2340 per cm energies gives a photon energy of 0.58 eV. (This matches the 0.53 eV band gap of a recently developed InGaAsSb diode described in G. W. Charache et al., "InGaAsSb thermophotovoltaic diode: Physics evaluation," Journal of Applied Physics, Vol. 85, No. 4, February 1999). The diodes 109 and 113 preferably have relatively low barrier heights, such as 0.05 to 0.4 volts.

The substrate diode 109 should be forward biased sufficiently (e.g., up to 3 volts) to raise its conduction and valence bands above the fermi level of the catalyst 105 so as to match the energy levels of the adsorbed reactants on the catalyst surface, such as oxygen or hydrocarbon free radicals. This induces resonant tunneling of energy into the substrate diode 109 by photons. The dimension of the oxide barrier or the depletion region should be kept to less than the ballistic transport dimension, which is on the order of 10 nanometers.

A metal such as Mg, Sb, Al, Ag, Sn Cu or Ni may be used to form an interlayer 106 between the catalyst 105 and the semiconductor of the substrate diode 109. The interlayer 106 serves to provide a lattice parameter match between the catalyst material and the substrate, which in turn provides a smooth and planar interface surface with which to construct a quantum well structure consisting of the catalyst, the vacuum above and the interlayer below. A quantum well structure with smooth interfaces alters the density of electron states in the directions toward the substrate and toward the vacuum, so as to enhance the number of electrons with the desired energy. The thickness of the catalyst and the interlayer should be small enough to permit ballistic transport of charge carriers. This dimension is typically less than 20 nanometers. Quantum well structures with thickness less than 0.5 nanometer are possible in the present state of the art. The quantum well structure may be constructed as an island, like a pancake on a surface (also referred to as a "quantum dot").

The device of FIG. 1 may also include a non-conducting layer 107 arranged between the substrate diode 109 and the catalyst 105. The layer 107, which can be comprised of an oxide, permits forward-biasing of the diode 109 without a significant increase in the forward current. The layer 107 provides a barrier against such forward current. An optional oxide 114 barrier may also be arranged on the surface of the device between the catalyst 105 and the surface diode 113.

Electrical contacts 101, 110 and 112 are arranged as shown in FIG. 1. Contacts 101 and 110 serve as electrical output leads for the substrate diode. Contacts 101 and 112 are the electrical output leads for the surface diode.

In the device of FIG. 1, the catalyst layer 105 may comprise a quantum well structure (including quantum dots) having a thickness typically less than 20 nm and being sufficiently small so as to alter the density of electron states in the catalyst to favor the production of substantially monoenergetic holes or electrons. The substrate diode 109 and the catalyst 105 may be separated by an interlayer 106 of metal that permits matching the lattice parameters of the catalyst to this interlayer. The catalyst 105 and interlayer 106 comprise the quantum well. The interlayer 106 must be sufficiently thin so as to permit non-energy changing electron transport into the diode. The thickness of the interlayer 106 should be preferably less than 20 nanometers.

In an exemplary embodiment of a device in accordance with the present invention, the substrate diode 109 comprises an n-type direct band gap semiconductor with a band gap chosen to favor the emission of energetic electrons.

In a further exemplary embodiment, the thickness or cluster size (if arranged in clusters) of the catalyst layer 105 is sufficiently small so as to permit the appearance of band gaps, discrete electron states and catalyst properties unlike the same material in bulk. In this case, the catalyst 105 can be comprised, preferably, of gold, silver, copper, or nickel and be arranged as monolayer, 200 atom clusters.

Figure 2:
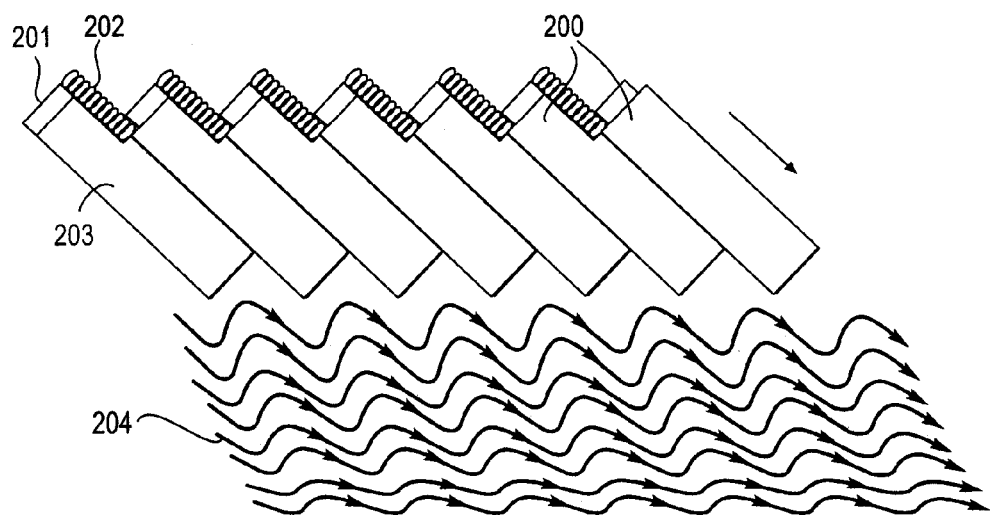
FIG. 2 shows a cross-section of an exemplary embodiment of a device for converting the energy released by a catalytic reaction into mechanical work.

FIG. 2 shows an exemplary embodiment of a device in accordance with the present invention in which the emissions of phonons generated by adsorbing and bonding reactions on or within catalyst surfaces, clusters or nanostructures are converted into hydraulic fluid pressure.

In accordance with the present invention, pressures generated by phonons directed into a catalyst body on a first side of the catalyst body form a phonon wave which can be guided by the geometry of the catalyst (or substrate upon which the catalyst may be situated) so that the phonons travel to the other side of the substrate and impart a pressure onto a fluid. The thickness of this travel should be less than the mean distance over which the direction of the phonon remains substantially unperturbed. The phonons arrive at an angle (a "grazing" angle) such that the directional and asymmetric pressure of the arriving phonons appears as wave motion on the other side of the catalyst body which pushes against a fluid such as a liquid metal or sacrificial interface, causing it to move in a direction parallel to the bottom surface. An apparent negative coefficient of friction between the wall and the fluid is exhibited due to the wave motion or directed impulses along the surface of the bottom of the device.

The exemplary device comprises a substrate 202 with top and bottom surfaces having a saw-tooth pattern, as shown in the cross-sectional view of FIG. 2. The bottom surface is in contact with a hydraulic fluid 204. As shown in FIG. 2, the substrate can be thought of as comprising a plurality of sub-structures 200 having rectangular cross-sections and arranged adjacent to each other at an angle with respect to the hydraulic fluid 204.

At the top surface of the substrate, each sub-structure 200 includes a layer 201 comprising a catalyst. On an exposed side surface between adjacent sub-structures, each sub-structure 200 includes a layer 202 of material which is inert with respect to the catalyst and the reactants. The body of each sub-structure is comprised of a substrate 203, which also acts as a phonon waveguide. Platinum can be used for the catalyst layer 201 and for the substrate 203 with air as the oxidizer, ethanol or methanol as the hydrocarbon reactant fuel and water or mercury as the hydraulic fluid 204. The hydraulic fluid can also serve as a coolant for the device, thereby permitting high power density operation.

The catalyst 201 and substrate 203 may be comprised of the same material, e.g., platinum. Other substrate materials may be used based on structural considerations, manufacturability and/or impedance matching so as to maximize the propagation of the phonon motion into the hydraulic fluid.

The thickness of the platinum catalyst layer 201 and substrate 203 should be less than the energy-changing mean free path of optical branch phonons or high frequency acoustic branch phonons, which is at least of order 10 nanometers and can be as large as one micron.

Nanofabrication methods can be used to form the saw-tooth patterns on the surfaces of the substrate 202, with the dimension of a unit of such pattern being as large as 1 micron.

By depositing the inert layers 202 as shown, e.g., on the right-facing facets of the saw-tooth pattern of the top surface, a preferential direction is thereby established for reactions and thus for phonon propagation, as indicated by the arrow in FIG. 2.

Acoustic, ultrasonic or gigahertz acoustic Rayleigh waves on the catalyst side can be used to stimulate the reaction rate and synchronize the emission of phonons. The waves increase the magnitude of the phonon emission and cause coherent emission, greatly enhancing both the peak and average power.

In a further embodiment, a thin layer or layers of material are arranged between the substrate and the fluid. These layers are comprised of materials having acoustic impedances between that of the substrate 202 and the hydraulic fluid 204, so as to maximize the transmission of momentum into the hydraulic fluid and minimize reflections back into the substrate 204. The material should be selected so that the bulk modulus and phonon propagation properties of the material cause the phonons emerging from the substrate to be transmittied substantially into the fluid with minimal reflection and energy loss.

In a further embodiment of a device in accordance with the present invention, the emissions of phonons generated by catalytic reactions are converted into electrical current by piezo-electric effects within materials as the phonons impact the materials. An exemplary embodiment of such a device is shown in FIG. 3.

Figure 3:
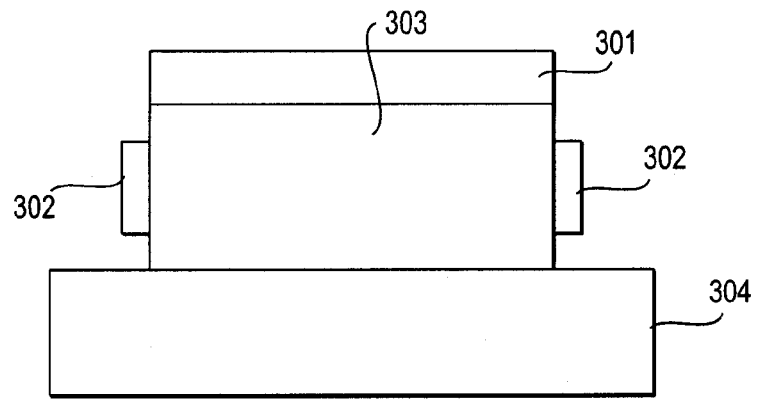
FIG. 3 shows a cross-section of an exemplary embodiment of a device for generating electricity piezoelectrically.

The exemplary device of FIG. 3 comprises a catalyst layer 301 arranged on a piezo-electric element 303, which is in turn arranged on a supporting substrate 304. The catalyst layer 301 can be implemented as a nanocluster, nanolayer or quantum well. Electrical leads 302 are provided at opposite ends of the piezo-electric element 303 across which a potential is developed, in accordance with the present invention. In the exemplary embodiment of FIG. 3, the catalyst layer 301 comprises platinum, with air as the oxidizer and ethanol or methanol as the hydrocarbon reactant fuel. The piezo-electric element 303 can comprise any piezomaterial, including semiconductors that are not normally piezoelectric, such as InGaAsSb. The lattice mismatch between the semiconductor and the platinum produces a strain, commonly called a deformation potential which induces piezo-electric properties in semiconductors, or ferroelectric or piezoelectric materials with a high nonlinearity such as (Ba,Sr)TiO3 thin films, AlxGa1−xAs/GaAs and strained layer InGaAs/GaAs (111)B quantum well p-i-n structures.

Where the piezoelectric element 303 is comprised of a semiconductor, the semiconductor becomes a diode element that converts photons into electricity, collects electrons as electricity, and converts phonons into electricity.

In the exemplary embodiment of FIG. 3, as the reactants interact with the catalytic layer 301, phonons generated by the reactions are conducted into the piezoelectric material 303. As a result, a potential is induced in the piezoelectric material 303 at the electrical contacts 302.

The geometry of the substrate 303 is preferably such as to focus phonons so as to enhance the nonlinearity of the piezoelectric element 303. This results in self-rectification of the high frequency phonons. In an exemplary embodiment, the piezoelectric element 303 is preferably curved and shaped like a lens or concentrating reflector so as to focus the phonons generated by the catalyst on to the piezoelectric material. The focusing of the phonons causes large amplitude atomic motions at the focus. The atomic motions induced by this focusing cause the piezoelectric material to become nonlinear, causing non-linear responses such as the generation of electricity in the material at the focus. This in turn results in the piezo-material becoming a rectifier of the phonon-induced high frequency current.

Acoustic, ultrasonic or gigahertz acoustic Rayleigh waves can be used on the catalyst side of the exemplary device of FIG. 3 to stimulate the reaction rate and synchronize the emission of phonons, to enhance the magnitude of the phonon emission and to cause coherent emission, greatly enhancing both the peak and average power delivered to the piezoelectric material 303. Acoustic Rayleigh waves accelerate oxidation reactions on platinum catalyst surfaces. Surface acoustic waves can be generated on the surface of the catalyst 301 using a generator (not shown). Such waves may have acoustic, ultrasonic or gigahertz frequencies. The Rayleigh waves induce reactions so as to synchronize the reactions, which in turn synchronizes the emission of phonons. The result is a pulsing bunching of the reactions, which enhances the power delivered to the piezoelectric material 303.

The frequency of operation of the device of FIG. 3 is preferably in the GHz range and lower so that rectification of the alternating currents produced by the piezoelectric material 303 can be achieved with conventional means, such as with semiconductor diodes.

Figure 4:
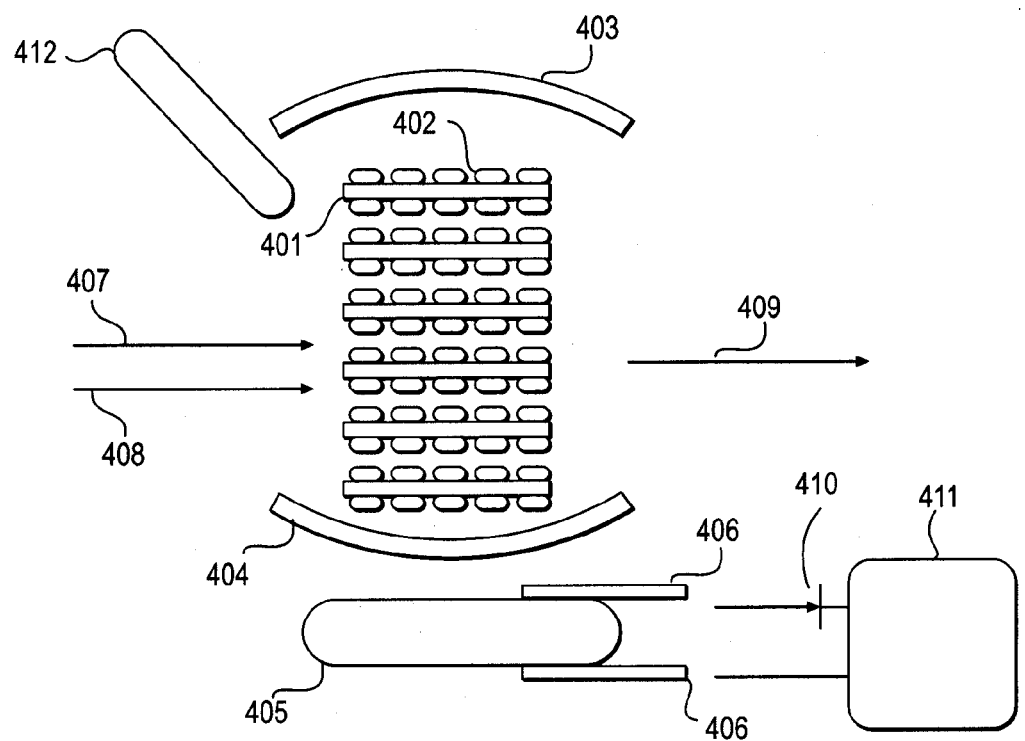
FIG. 4 shows an exemplary embodiment of an arrangement for generating electricity or radiation beams in accordance with the present invention.

In a further exemplary embodiment of the present invention, electromagnetic radiation, such as infrared photons emitted by excited state products such as highly vibrationally excited radicals and final product molecules, is converted into electricity photovoltaically. Stimulated emission of radiation is used to extract the energy from the excited state products, such as highly vibrationally excited radical and reaction product molecules both on the catalyst surface and desorbing from it. The extracted energy appears in the form of a coherent beam or a super-radiant beam of infra-red or optical energy. The frequencies of the radiation correspond to fundamental (vibration quantum number change of 1) or overtones (vibration quantum number change 2 or greater) of the normal mode vibration frequencies of the reactants. Several different frequencies may be extracted simultaneously in this invention. While the resulting coherent beam is useful in its own right, this high intensity beam can also be photovoltaically converted into electricity. In accordance with the present invention, such emissions are created by reactions on catalyst surfaces, and are accelerated by the use of optical cavities. FIG. 4 shows an exemplary embodiment of an electric generator for performing such a conversion.

The device of FIG. 4 comprises one or more substrates 401 upon which a catalyst 402 is arranged in a plurality of islands, nanoclusters, quantum well clusters or quantum dots. The catalyst clusters are sufficiently spaced apart (e.g., tens of nanometers or more) and the substrate is made sufficiently thin (e.g., less than a centimeter total optical thickness), so that IR absorbtion is mitigated at the frequencies of specie emission. The assembly of catalyst clusters on the substrates 401 is substantially transparent to the reaction radiations. The catalyst 402 is preferably platinum or palladium. The device preferably comprises a plurality of substrates 401 stacked so as to permit a volume of reactions.

The catalyst-substrate stack 401/402 is enclosed in an optical cavity having a highly reflective element 403 and a less reflective element 404 arranged as shown in FIG. 4. The optical cavity and the catalyst-substrate stack 401/402 are preferably resonant to the reaction radiations or their overtones. The optical cavity can be used to stimulate overtone radiation, i.e., multipole radiation where the change in quantum number is 2 or more, to increase the energy of the radiation. The optical cavity preferably has multiple frequencies, as in a Fabrey-Perot cavity, that are tuned to overtones of the specie frequencies.

A fuel 407, such as hydrogen, ethanol or methanol and an oxidizer 408, such as air, are introduced into the optical cavity where they interact with the catalyst-substrate stack 401/402. Lean mixtures of fuel can be used so as to minimize resonant transfer, exchange or decay of excited state vibrational energy to other specie of the same chemical makeup in the exhaust stream, during the time these species are in the optical cavity and the photovoltaic converter 405 collects the radiation and converts it into electricity.

A stimulated emission initiator and synchronizer device 412 is used to initiate and synchronize the emissions in the optical cavity. The device 412 can be a commonly available stimulated emission oscillator and can be coupled to the device of the present invention in known ways. The optical cavity can be designed in a known way to create stimulated emission of radiation. A photovoltaic cell is typically not very efficient in converting long wavelength IR photons (1000 to 5000 per centimeter) characteristic of the catalytic reactions. The high peak power output of the device 412 remedies this situation and makes the IR photovoltaic cell more efficient.

A photovoltaic converter 405 is placed outside the volume of the catalyst-substrate stack 401/402 anywhere visible to the emitted radiation. Such a placement allows cooling the photovoltaic collector 405 using known methods. The electrical output leads 406 of the photovoltaic collector 405 can be coupled to an electrical energy storage device 411 via a diode 410. The output of the photovoltaic converter 405 is in pulses with the pulse rate typically being greater than one megahertz. The electrical energy storage device 411 may comprise, for example, a capacitor, super-capacitor or battery. Given the high frequency of the pulsed output, a capacitor used as the storage device 411 can be quite compact. The capacitor need only be large enough to collect the energy of a single pulse. The energy stored in the capacitor can thus be millions of times less than the energy delivered by the converter 405 in one second.

The chemical reactants on the catalyst surface permit overtone transitions because they are part of a "ladder" of transitions and strongly polarized on the catalyst surface, which permits all the transitions to have non-zero dipole radiation transition matrix elements. Also, the reactants have no rotational smearing associated with free molecules in a gas because they are attached to the surface and can not rotate. These features permit a near monochromatic overtone light amplification by stimulated emission of radiation.

The electromagnetic energy radiated by the stimulation of species, as in the embodiment of FIG. 4, can be formed into high brightness, quasi-monochromatic, poly-chromatic radiations or coherent beams.

In each of the above described embodiments which include photovoltaic semiconductors, the catalyst is preferably operated at a high surface power density, e.g., in excess of 10 watts per square centimeter or with a peak surface power density of at least one watt per square centimeter, to enhance the efficiency of the photovoltaic semiconductors.

A diode energy converter, in one embodiment, may be formed with identifiable regions. For example, a region associated with chemical reactions is isolated chemically from the other regions. A region associated with forming a Schottky diode is formed with metals that form energy barriers of the desired height. A region associated with tailoring the boundary between semiconductor material and metal materials is formed so that the junction does not tear apart and so that it forms a reasonably consistent and uniform diode. A region associated with removing heat from the semiconductor provides a substrate that conducts heat as well as support the device. The electric generating device thus formed, in one embodiment, survives physically and mechanically and operates electrically in an environment of heated chemical reactions.

There are many configurations that can satisfy the specifications of these regions. A common element in the region of chemical reactions may include a conducting surface. The vibrationally excited specie contact and interact electronically with the conducting surface. Hot electrons are generated in the conductor as a result of the interaction. On the conducting surface, as part of the surface or near it, one or more catalysts are placed to guide, control or stimulate both the chemical reactions and the location and form of the chemical reaction intermediates. The catalysts may typically be conductors. Typically, the catalysts include conducting metals such as platinum, palladium, gold nanostructures, vanadium and other metals. Catalysts may typically include conducting oxides such as $RuO_2$ (ruthenium oxide). Catalysts may be placed on or next to non-conductors such as titanium oxides or vanadium oxides, where the combinations are also referred to simply as "catalysts."

Associated with the conducting surface is a conductor that isolates the chemical reactions and the associated highly reactive intermediates from the metal or material that forms the Schottky barrier. Since adsorbed hydrogen atoms may typically appear as adsorbed reaction intermediates, a material that acts as a barrier to hydrogen diffusion may be used. Gold provides such a barrier and gold also has a relatively long mean free path for hot electrons. A nanolayer or nanostructure of gold is therefore an example of a material that stops hydrogen and other chemicals from migrating through it and is relatively transparent to hot electrons.

In one embodiment, a common element used when forming a Schottky diode with the desired metal includes an interface between the metal and the semiconductor. The relative surface energy of materials at that interface determines in part whether one will ball up on the other or tear away from the other, or whether it will wet and form a continuous layer on the other. The metal that does not ball up or tear away is often different from one that forms the desired Schottky barrier.

The surface energy condition can be satisfied with a single layer or fractional layer of atoms of a material with the desired surface energy property. When more than one layer is used, then that layer may determine the Schottky barrier properties.

In one embodiment, a common element associated with a supporting substrate is that it conducts heat. The device may typically be immersed in a flow of gas such as a fuel and air mixture. The flow of air may typically be far in excess of what is needed to provide oxygen and may typically be determined by the need to convect or otherwise carry away waste heat.

Figure 5:
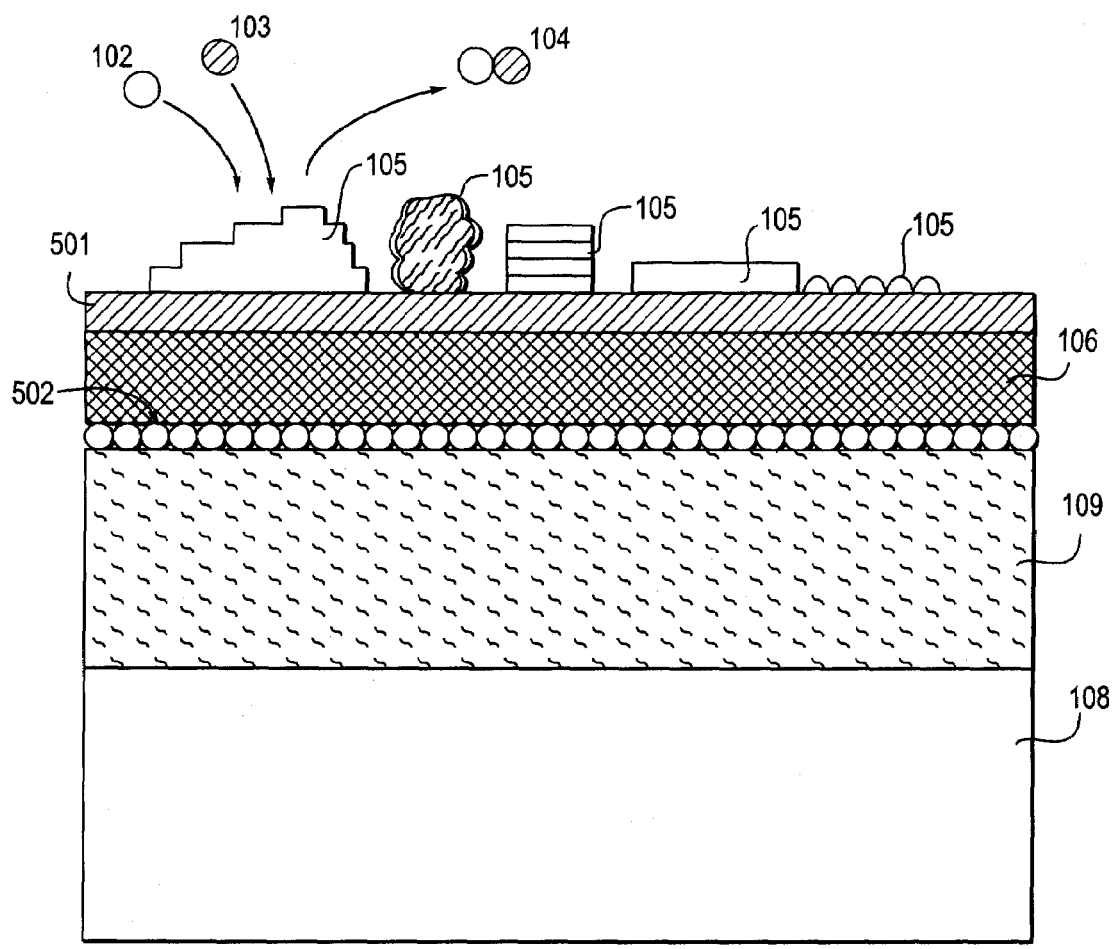
FIG. 5 shows a cross section of multiple nanostructures, semiconductor and substrate of a Schottky diode energy converter in one embodiment.

FIG. 5 shows schematically the cross section of a device addressing the properties of the various regions in one embodiment. The region shown in FIG. 5 associated with reactants such as fuel 102, air oxidizer molecules 103 and exhausts 104 comes in contact with a conducting surface 105 that may include catalysts such as platinum, palladium, Ruthenium, or Ruthenium oxide. The conductor/catalyst may include, but is not limited to, a nanostructure that can be one of a set of stepped monolayers, an irregular shape or clump, a composite clump, regular or irregular monolayers composed of differing materials often referred to as quantum wells, or any one of many structures, all of which have the common feature that they are a nanolayer, nanocluster, quantum well, or combinations thereof.

In one embodiment, this conducting layer 105 is placed on a stabilizing interlayer conductor 501, which acts as a barrier against chemical transport. The stabilizing interlayer conductor 501 may also be a nanostructure such as nanolayer, nanocluster, quantum well, or combinations thereof.

In one embodiment, the stabilizing interlayer conductor 501 is placed on the Schottky conductor 106, which may also be an interlayer material. The Schottky conductor 106 may also be formed as a nanostructure such as a nanolayer, nanocluster, quantum well, or combinations thereof.

In one embodiment, the Schottky conductor 106 is placed on a tailoring material 502, which may be a monolayer or sub-monolayer of material. In one embodiment, the tailoring material 502 is chosen to stabilize the mechanical and materials junction between the underlying semiconductor 109 and the Schottky conductor 106.

One or more of the materials chosen for the stabilizing interlayer conductor 501, the Schottky conductor 106 and the tailoring material 502 may under some conditions be formed from the same material. For example, gold (Au) is a good chemical barrier material against hydrogen, hydrocarbon-oxygen reaction intermediates and oxygen, a good electrical conductor, and forms a Schottky barrier on the wide bandgap semiconductor TiO2. Gold is compatible with forming a layer on the semiconductor material TiO2 and with maintaining that layer at temperatures above 100 Celsius.

In one embodiment, the tailoring material 502 is placed on the semiconductor 109 which is in turn formed on a thermally conducting support and substrate 108.

Not shown for clarity are electrodes to the semiconductor 109, and the electrodes to the conductors 105, 501, 106, 502. The electrodes to the conductors 105, 501, 106, 502 can be made to one or more of these conductors as convenience permits. The electrodes to the semiconductor 109 can be similarly made to convenience.

In one embodiment, the thermal conductivity of the substrate 108 and semiconductor 109 typically removes heat from conductors 105, 501, 106, 502 at such a high rate that nanometer thick conductors may safely carry orders of magnitude more current than isolated conductors such as wires of the same thickness.

Figure 6:
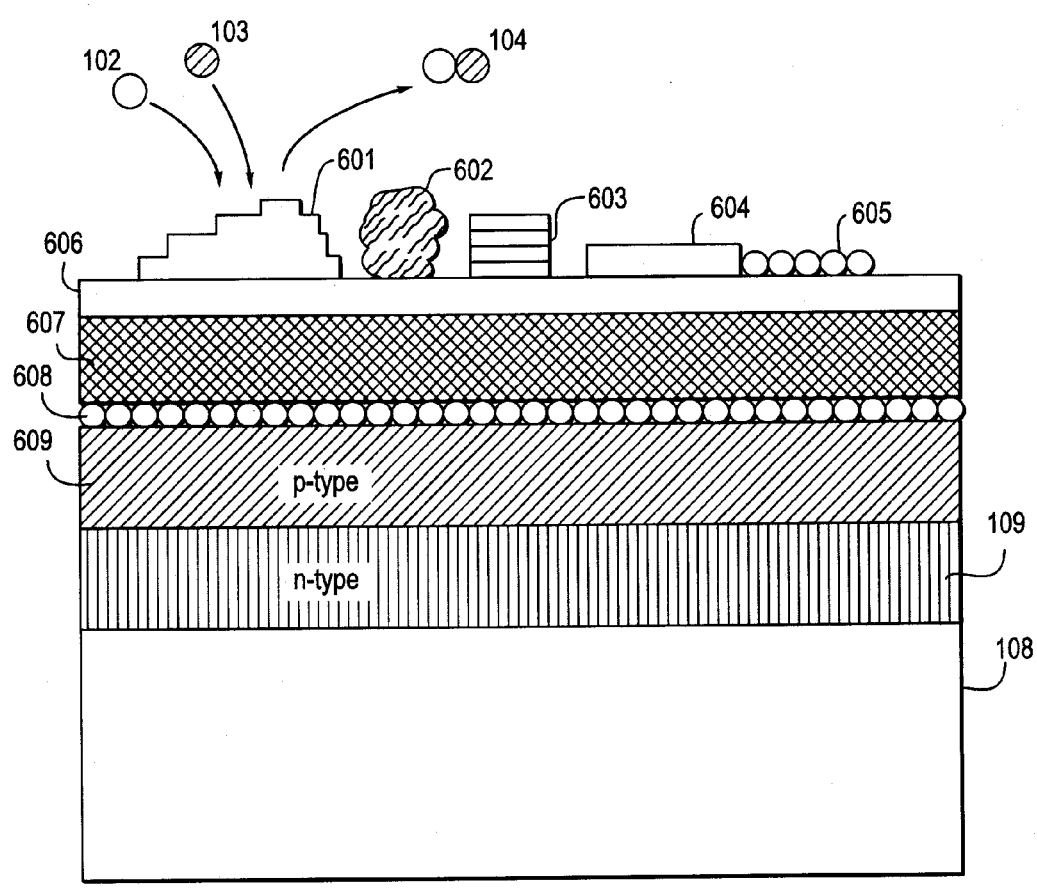
FIG. 6 shows a cross section of multiple nanostructures, a semiconductor and substrate of a pn junction diode energy converter in one embodiment.

The principles associated with optimizing a Schottky converter are general and apply to a pn junction converter as well. FIG. 6 shows a cross section of an example of the method applied to forming a pn junction energy converter. The region associated with reactants such as fuel 102, air oxidizer molecules 103 and exhausts 104 comes in contact with a conductor/catalyst 601 through 605 and 606 that may include catalysts such as platinum, palladium or Ruthenium oxide.

The conductor/catalyst may include, but is not limited to, a conducting nanostructure that may include one or more of a set of stepped monolayers 601, an irregular shape or clump 602, a composite clump 602, regular or irregular monolayers composed of differing materials often referred to as quantum wells 603, or any one of many structures 604 and 605, all of which have the common feature that they are a nanolayer, nanocluster, quantum well, or combinations thereof.

In one embodiment, this conductor/catalyst 601, 602, 603, 604, 605 is placed on a stabilizing interlayer conductor 606 which acts as a barrier against chemical transport. The stabilizing interlayer conductor 606 is also a nanostructure such as a nanolayer, nanocluster, quantum well, or combinations thereof, in one embodiment.

In one embodiment, the stabilizing interlayer conductor 606 is placed on an ohmic contact material 607. The ohmic contact material 607 is also formed as a nanostructure such as a nanolayer, nanocluster, quantum well, or combinations thereof, in one embodiment.

The tailoring material 608 and ohmic contact material 607 make a stable ohmic contact to the semiconductor 609, shown as a p-type semiconductor. The tailoring material 608 is chosen to tailor the physical properties of the junction between ohmic contact material 607 and semiconductor material 609.

Hot electrons with energy greater than the band gap of the semiconductor 109 and generated in the conductor/catalyst elements 601, 602, 603, 604, 605 and 606 are transported though elements 607, 608 and into the conduction band of the p-type semiconductor, become minority carriers. The junction of the p-type semiconductor 609 and n-type semiconductor 109 provides an electric field that draws the minority carriers from the p-type semiconductor 609 conduction band to the n-type semiconductor conduction band. The hot electrons have thereby been converted first into minority carriers and then into majority carriers. The method shown produces a useful electric potential and forward bias across the pn junction.

A person of ordinary skill in the art will appreciate that it is common practice to heavily dope one or both semiconductor elements and to vary the composition of the semiconductors over dimension. Accordingly, the semiconductors disclosed in this application may be doped or heavily doped, and varied in composition over dimension as desired.

Not shown for clarity are the electrodes to the semiconductor and metal elements.

We claim:

1. An electric generator converting pre-equilibrium chemical reaction product energy into electrical potential, comprising:

a junction of a semiconductor and a conductor material, a stabilizing interlayer conductor formed on the conductor material that physically isolates chemical reactants from the junction;

a conducting surface formed on the stabilizing interlayer conductor, the conducting surface formed from one or more nanostructures in contact with or near a region containing chemical reaction products; and a tailoring material on which the conductor material is formed arranged to prevent junction tearing and to form a uniform diode;

wherein the tailoring material is formed on the semiconductor, where the conductor material, the stabilizing interlayer conductor, the conducting surface, and the tailoring material are ballistic charge carrier conductors.

2. The electric generator of claim 1, further including a substrate on which the semiconductor is formed, wherein the substrate has a region in thermal contact with the flow of the chemical reactants.

3. The electric generator of claim 2, wherein the substrate includes at least a heat conducting substrate in thermal contact with the region in thermal contact with the flow of the chemical reactants.

* * * * *